United States Patent  
Lee

(10) Patent No.: US 7,583,145 B2
(45) Date of Patent: Sep. 1, 2009

(54) HYBRID OUTPUT STAGE APPARATUS AND RELATED METHOD THEREOF

(75) Inventor: Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/829,079

(22) Filed: Jul. 26, 2007

(65) Prior Publication Data

US 2008/0024228 A1    Jan. 31, 2008

(30) Foreign Application Priority Data

Jul. 28, 2006   (TW) .............................. 95127844 A

(51) Int. Cl.
*H03F 3/45* (2006.01)
(52) U.S. Cl. ...................................... 330/255; 330/264
(58) Field of Classification Search .................. 330/255, 330/262, 263, 133
See application file for complete search history.

(56) References Cited

U.S. PATENT DOCUMENTS 4,422,050 A * 12/1983 Suzuki ........................ 330/263
5,162,753 A * 11/1992 Khorramabadi ............. 330/264
6,788,147 B1 * 9/2004 Lubbers ...................... 330/264

* cited by examiner

*Primary Examiner*—Robert Pascal
*Assistant Examiner*—Hieu P Nguyen
(74) *Attorney, Agent, or Firm*—Winston Hsu

(57) ABSTRACT

The present invention discloses an apparatus for generating an output signal according to an input signal, including a signal generating circuit for generating a first and a second control signal according to the input signal; a first output stage has a first amplifying configuration for receiving the first control signal; and a second output stage has a second amplifying configuration for receiving the second control signal, wherein the first amplifying configuration is different from the second amplifying configuration.

20 Claims, 5 Drawing Sheets

US 7,583,145 B2

HYBRID OUTPUT STAGE APPARATUS AND RELATED METHOD THEREOF

CROSS-REFERENCE TO RELATED APPLICATIONS

This application claims priority from pending Taiwan application number 095127844, filed Jul. 28, 2006, and made public under publication number 200807868, these contents of which are incorporated herein by reference.

BACKGROUND OF THE INVENTION

1. Field of the Invention

The present invention relates to an output stage scheme, and more particularly to a hybrid output stage apparatus and related method thereof.

2. Description of the Prior Art

Normally, an operational amplifier is a two-stage configuration, which includes a first amplifying circuit (i.e. amplifying stage) and a second outputting circuit (i.e. output stage). Operational amplifiers can be further classified into class A amplifiers, class B amplifiers, and class AB amplifiers. Please refer to FIG. 1. FIG. 1 is a diagram illustrating a prior art class A amplifier 10, class B amplifier 20, and class AB amplifier 30, and their respective operational characteristics (i.e. the relationship between the output voltage and the driving current). According to FIG. 1(a), the P-type transistor $M_p$ of the class A amplifier is conducting for the whole wave swing of the input signal $V_{in}$ (the current $I_{mp}$ is the conduct current of the P-type transistor $M_p$), i.e. the conduct angle is 360°. Accordingly, the power efficiency of the class A amplifier 10 is not higher than 25%. According to FIG. 1(b), the bias current $I_{bias}$ of the class A amplifier 10 should be relatively high so that the class A amplifier 10 have the conduct angle of 360°, and this is what causes the low power efficiency of the class A amplifier 10. Therefore, for some applications that require higher power efficiency, the class B amplifier 20 or the class AB amplifier 30 is a preferred choice. According to FIG. 1(c), when the class B amplifier 20 is in a static condition, the P-type transistor $M_p$ and the N-type transistor $M_n$ are just in the edge of the cut-off region. Therefore, both the P-type transistor $M_p$ and the N-type transistor $M_n$ respond to a half-wave swing of the input signal $V_{in}$ (the current $I_{mp}$ is the conduct current of the P-type transistor $M_p$ and the current $I_{mn}$ is the conduct current of the N-type transistor $M_N$), i.e. a conduct angle of 180°. Accordingly, the power efficiency of the class B amplifier 20 is not higher than 78.5%. Furthermore, according to FIG. 1(d), to obtain the conduct angle of 180°, the bias current $I_{bias}$ of the class B amplifier 20 should be equal to zero, so that the class B amplifier 20 has a higher power efficiency than the class A amplifier 10. However, because the static bias current $I_{bias}$ is zero, it results in the class B amplifier 20 being turned off, and the output voltage $V_o$ is much more easily interfered with by noise, that is to say, the distortion of the output voltage $V_o$ is also more serious.

According to FIG. 1(e), the P-type transistor $M_p$ and the N-type transistor $M_n$ of the class AB amplifier 30 in the static condition are turned on slightly. Therefore, both the P-type transistor $M_p$ and the N-type transistor $M_n$ respond to at least a half-wave swing of the input signal $V_{in}$ (the current $I_{mp}$ is the conduct current of the P-type transistor $M_p$ and the current $I_{mn}$ is the conduct current of the N-type transistor $M_N$), i.e. a conduct angle larger than 180°. Accordingly, the power efficiency of the class AB amplifier 30 is between the power efficiency of the class A amplifier 10 and the class B amplifier 20. Furthermore, according to FIG. 1(f), because the bias current $I_{bias}$ of the class AB amplifier 30 is not zero in the static condition, the larger sized P-type transistor $M_p$ and N-type transistor $M_n$ will consume more static current of the class AB amplifier 30.

Please refer to FIG. 2. FIG. 2 is a diagram illustrating the bias voltage of a prior art class AB amplifier 200. The bias configuration of the class AB amplifier 200 is implemented by utilizing a current $I_o$ to flow through a resistor 202 (the value of the impedance is Z) formed by a transistor network. By selecting an appropriate value of $I_o \times Z$, the currents $I_{(Mop1)}$, $I_{(Mon1)}$ of the P-type transistor $M_{op1}$ and the N-type transistor $M_{on1}$ respectively will not be zero at the same time regardless of any value of the output voltage $V_{out}$. In other words, the class AB amplifier 200 has a better ability to resist noise. On the other hand, through an appropriate setting of the aspect ratio $(W/L)_2$ of the N-type transistor $M_{on1}$, the class AB amplifier 200 will have the largest output current $I_{N(max)}$ as shown below:

$$I_{N(\max)} = 0.5 \times K_n \times (W/L)_2 \times (V_{n1})^2 \quad (1)$$

$$= 0.5 \times K_n \times X \times (V_{n1})^2, \text{ where } X = (W/L)_2.$$

According to equation (1), $K_n$ is the conductivity parameter of the N-type transistor. Therefore, static current still exists in the class AB amplifier 200. That is to say, the class AB amplifier 200 still has static power consumption problem in the static condition.

SUMMARY OF THE INVENTION

One of the objectives of the present invention is to provide a hybrid output stage apparatus and related method thereof to solve the above-mentioned problem.

One of the objectives of the present invention is to provide a hybrid output stage apparatus and related method thereof to improve the power consumption problem in the static condition.

One of the objectives of the present invention is to provide a hybrid output stage apparatus and related method thereof to have great driving ability of current for the hybrid output stage circuit.

One of the objectives of the present invention is to provide a hybrid output stage apparatus and related method thereof to save more energy of electric power.

One of the objectives of the present invention is to provide a hybrid output stage apparatus and related method thereof to have stronger anti-noise ability for the hybrid output stage circuit.

According to an embodiment of the present invention, an apparatus is provided for generating an output signal according to an input signal. The apparatus comprises: a signal generating circuit, a first output stage, and a second output stage. The signal generating circuit generates a first control signal and a second control signal according to the input signal; the first output stage has a first amplifying configuration for receiving the first control signal and generating a first output signal; and the second output stage has a second amplifying configuration for receiving the second control signal and generating a second output signal, wherein the first amplifying configuration is different from the second amplifying configuration; wherein the first output stage is coupled to the second output stage to form an output terminal, and the output terminal outputs from at least one of the first output signal and the second output signal as the output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
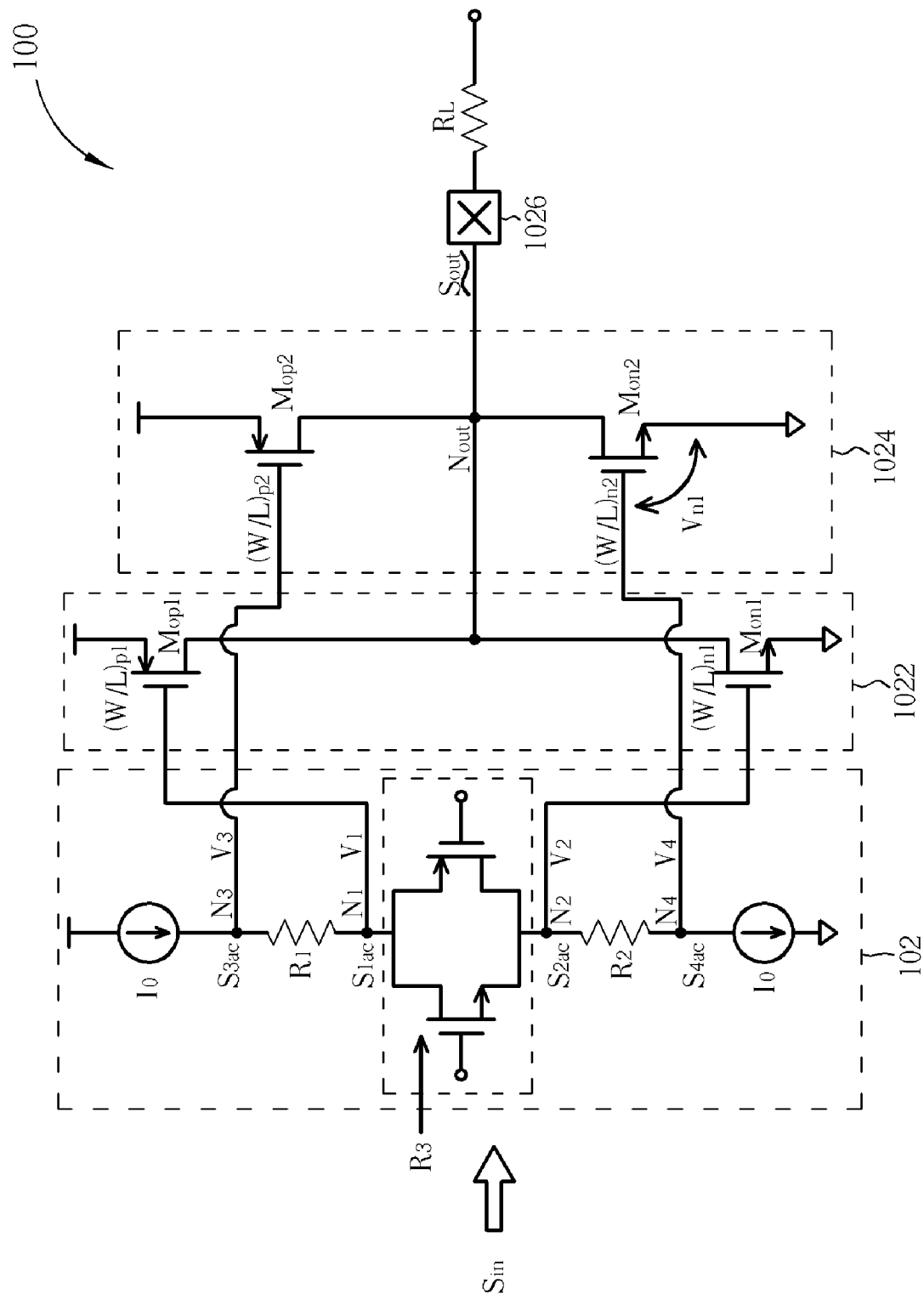
FIG. 3 is a diagram illustrating an apparatus according to an embodiment of the present invention.

Please refer to FIG. 3. FIG. 3 is a diagram illustrating an apparatus 100 according to an embodiment of the present invention. The apparatus 100 generates an output signal $S_{out}$ according to an input signal $S_{in}$, the apparatus 100 comprising a signal generating circuit 102, a first output stage 1022, and a second output stage 1024. The signal generating circuit 102 generates a first control signal and a second control signal according to the input signal $S_{in}$; the first output stage 1022 comprises a first amplifying configuration for receiving the first control signal and generating a first output signal according to the first control signal; and the second output stage 1024 comprises a second amplifying configuration for receiving the second control signal and generating a second output signal according to the second control signal, wherein the first amplifying configuration is different from the second amplifying configuration. Furthermore, the first output stage 1022 is coupled to the second output stage 1024 to form an output terminal 1026, and the output terminal 1026 outputs at least one of the first output signal and the second output signal as the output signal $S_{out}$. In addition, an amount of the second output signal is larger than that of the first output signal in this embodiment.

The first control signal comprises a first voltage signal $S_{1ac}$ and a second voltage signal $S_{2ac}$, and the second control signal comprises a third voltage signal $S_{3ac}$ and a fourth voltage signal $S_{4ac}$. The signal generating circuit 102 comprises a first impedance device $R_1$, a second impedance device $R_2$, and a third impedance device $R_3$; the first impedance device $R_1$, the second impedance device $R_2$, and the third impedance device $R_3$ are utilized for generating the first voltage signal $S_{1ac}$, the second voltage signal $S_{2ac}$, the third voltage signal $S_{3ac}$, and the fourth voltage signal $S_{4ac}$ respectively according to the input signal $S_{in}$. Furthermore, the voltage level $V_3$ of the third voltage signal $S_{3ac}$ is higher than the voltage level $V_1$ of the first voltage signal $S_{1ac}$, and the voltage level $V_2$ of the second voltage signal $S_{2ac}$ is higher than the voltage level $V_4$ of the first voltage signal $S_{4ac}$. In this embodiment, the first output stage 1022 comprises a first P-type transistor $M_{op1}$ coupling to a first N-type transistor $M_{on1}$ in series, and the first output stage 1022 is biased to become a class AB amplifying configuration (the first amplifying configuration), and the second output stage 1024 comprises a second P-type transistor $M_{op2}$ coupling to a second N-type transistor $M_{on2}$ in series, and the second output stage 1024 is biased to become a class B amplifying configuration (the second amplifying configuration), as shown in FIG. 3. In this embodiment, the first impedance device $R_1$ and the second impedance device $R_2$ are implemented by transistors. For brevity, the third impedance device $R_3$ is only implemented by a P-type transistor and an N-type transistor, but this is not a limitation of the present invention. Those skilled in this art will know that other types of transistors network can also be adopted after reading the disclosure of the present invention. The first output stage 1022 and the second output stage 1024 of the apparatus 100 are coupled to a next stage circuit through an output terminal $N_{out}$ of the output terminal 1026. In this embodiment, the next stage circuit is equivalent to a resistor $R_L$.

Figure 1:
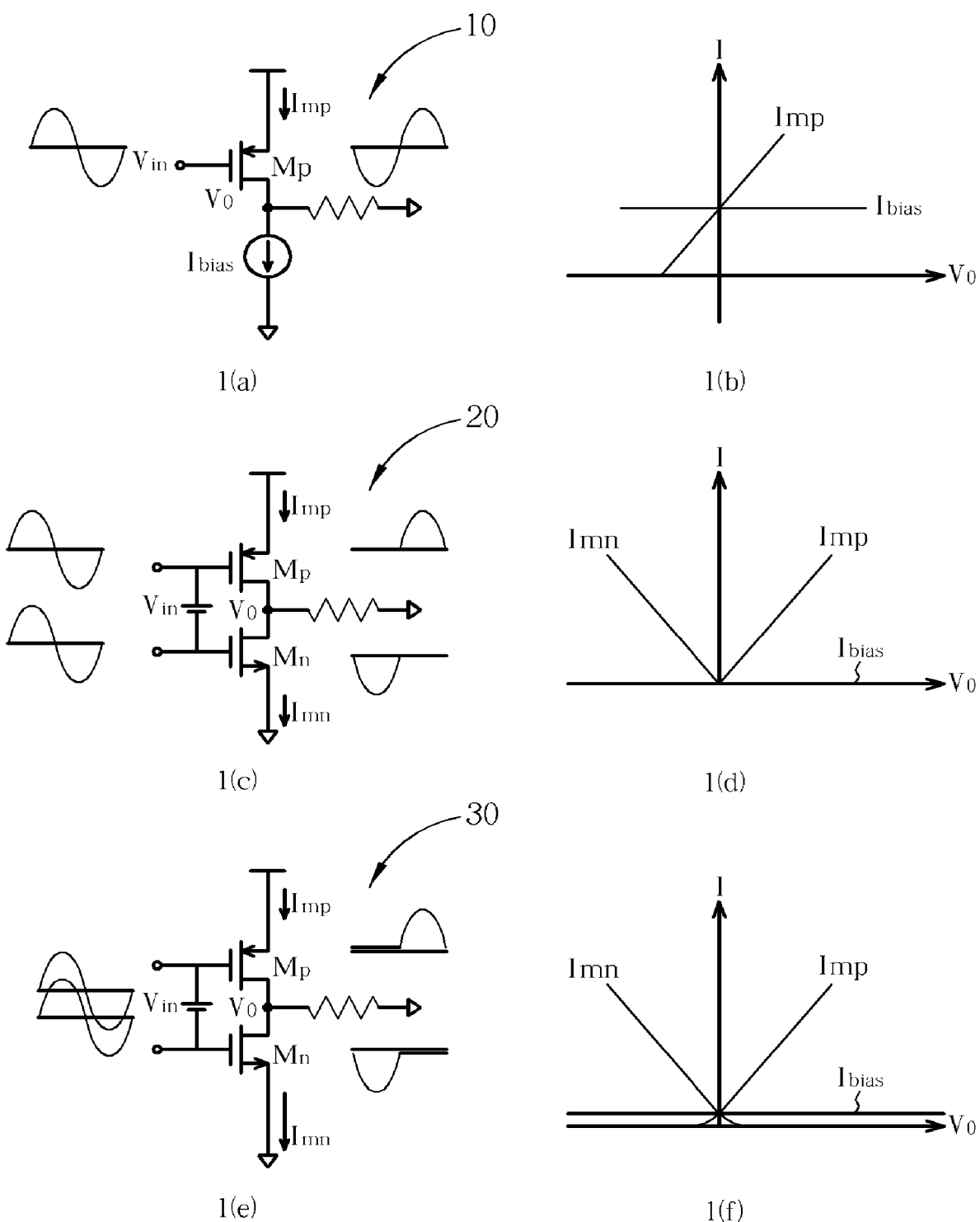
FIG. 1 is a diagram illustrating a prior art class A amplifier, class B amplifier, and class AB amplifier, and their respective operational characteristics.
Figure 2:
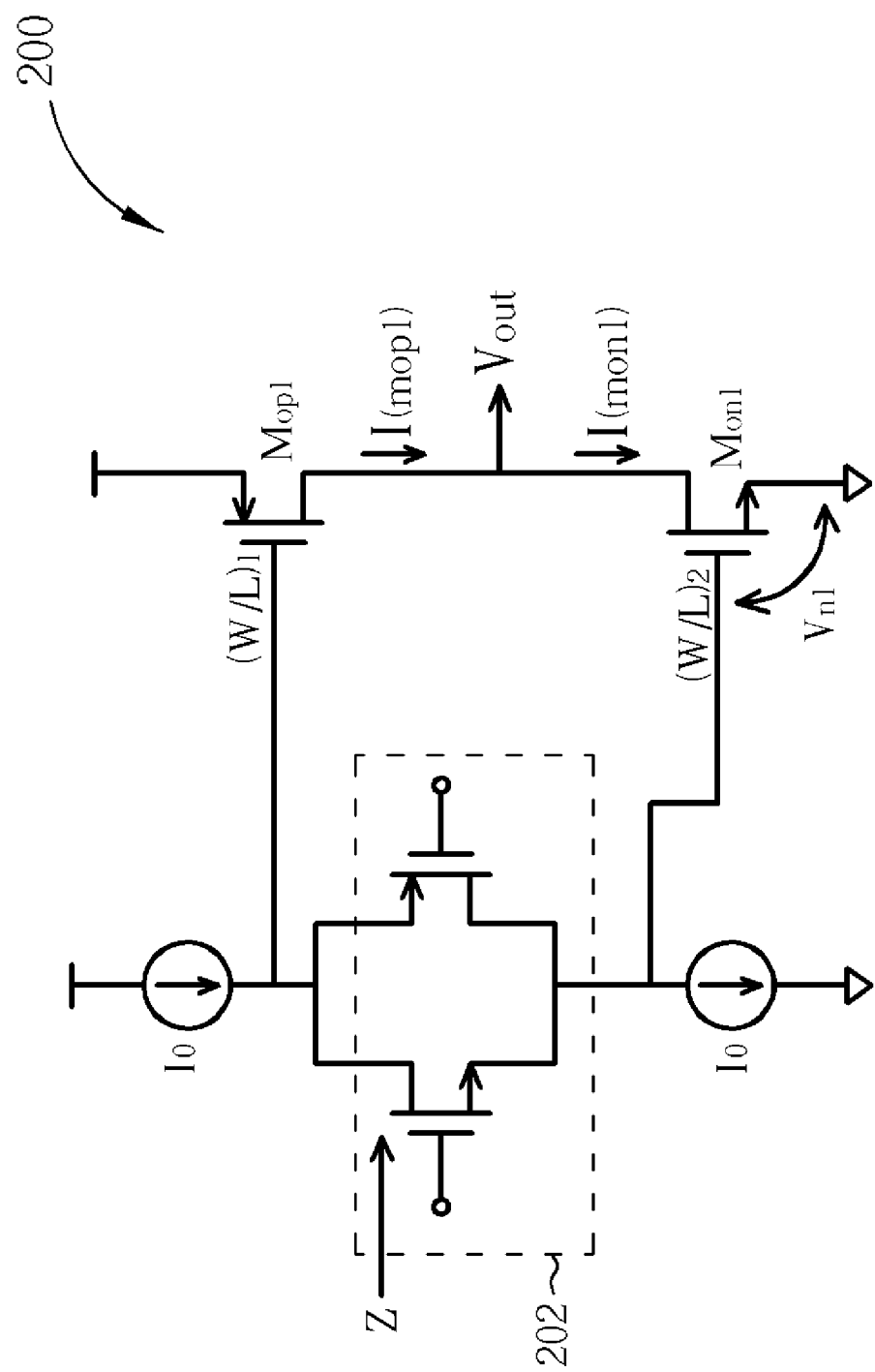
FIG. 2 is a diagram illustrating the bias voltage of a prior art class AB amplifier.

When the apparatus 100 of the present invention receives the input signal $S_{in}$, the terminals $N_1$, $N_2$, $N_3$, $N_4$ are coupled to the voltage levels $V_1$, $V_2$, $V_3$, $V_4$ respectively. In this embodiment, the aspect ratio $(W/L)_{p1}$ and $(W/L)_{p2}$ of the first P-type transistor $M_{op1}$ and the second P-type transistor $M_{op2}$ are $\beta_p$ and $(X-\beta_p)$ respectively. The aspect ratio $(W/L)_{n1}$ and $(W/L)_{n2}$ of the first N-type transistor $M_{on1}$ and the second N-type transistor $M_{on2}$ are $\beta_n$ and $(Y-\beta_n)$ respectively. Please refer to FIG. 2 again. It can be seen that the total area of the output stage transistor of the apparatus 100 of the present invention is the same as the area of the output stage transistor of the prior art, i.e. X and Y. Therefore, even though the apparatus 100 of the present invention utilizes more transistors, the chip area will not be increased through the appropriated design. However, because the voltage levels $V_1$, $V_2$, $V_3$, $V_4$ at the terminals $N_1$, $N_2$, $N_3$, $N_4$ of the apparatus 100 can turn on the first P-type transistor $M_{op1}$ and the first N-type transistor $M_{on1}$, and turn off the second P-type transistor $M_{op2}$ and the second N-type transistor $M_{on2}$ when the apparatus 100 remains in the static condition, therefore, the static power consumption can be reduced. Please refer to the prior art class AB amplifier 200 in FIG. 2. Because the aspect ratio $(W/L)_{p1}$ of the first P-type transistor $M_{op1}$ is smaller than the aspect ratio $(W/L)_1$ of the P-type transistor $M_{op1}$ of the prior art, and the aspect ratio $(W/L)_{n1}$ of the first N-type transistor $M_{on1}$ is smaller than the aspect ratio $(W/L)_2$ of the N-type transistor $M_{on1}$ of the prior art, the static DC current of the apparatus 100 of the present invention is smaller than the static current of the prior art. In addition, when the second output signal is larger than the first output signal, that is to say, the aspect ratio $(W/L)$ of N-type and P-type transistors in the second output stage 1024 are larger than the aspect ratio $(W/L)$ of N-type and P-type transistors in the first output stage 1022, the apparatus 100 of the present invention will expense the ability of anti-noise in the static condition but save the power consumption greatly in the static condition. As mentioned above, if the second output signal is smaller than the first output signal, the apparatus 100 of the present invention will have more the power consumption in the static condition but enhance the ability of anti-noise in the static condition.

Figure 4:
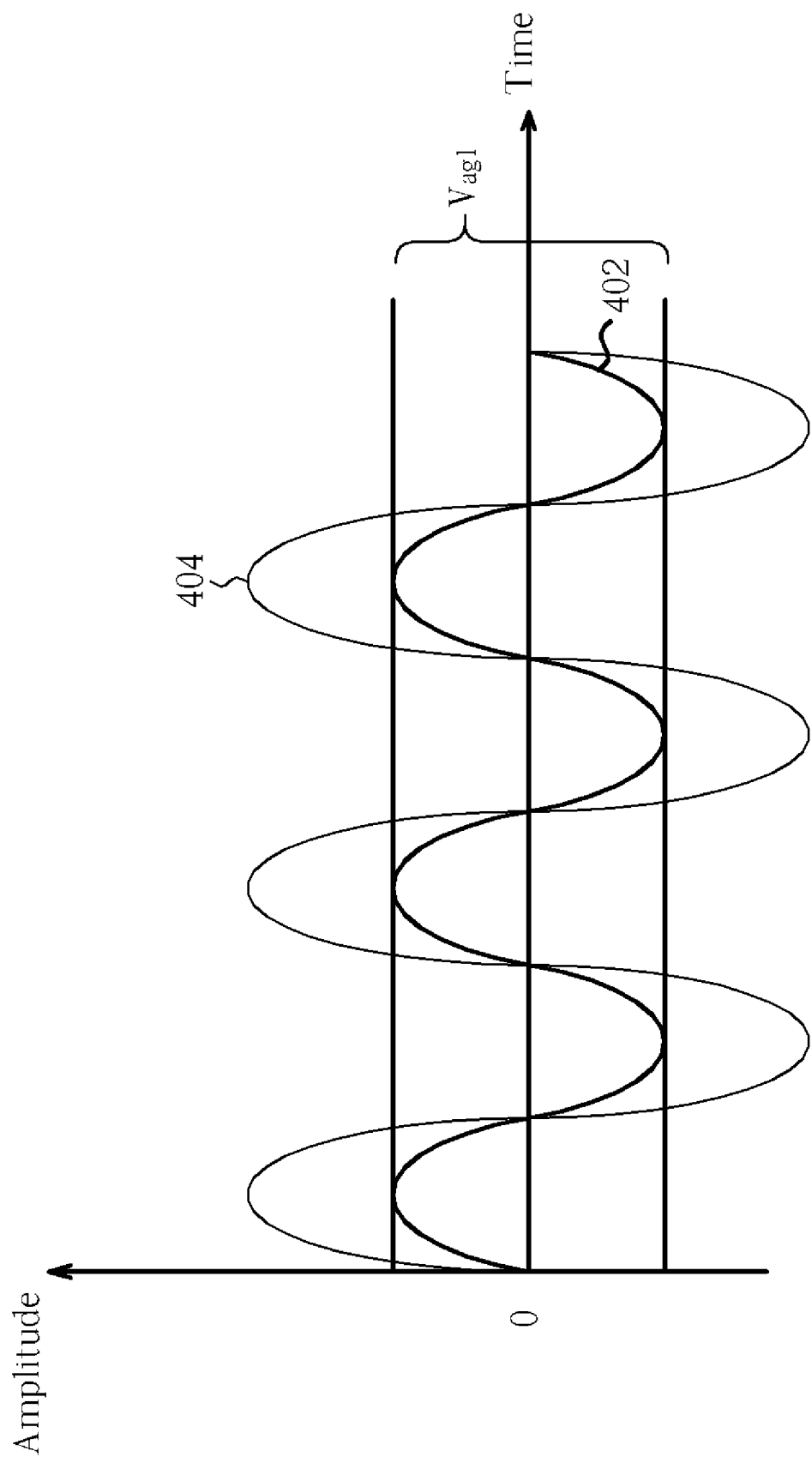
FIG. 4 is a waveform diagram illustrating the input signal of the apparatus of FIG. 3.
Figure 5:
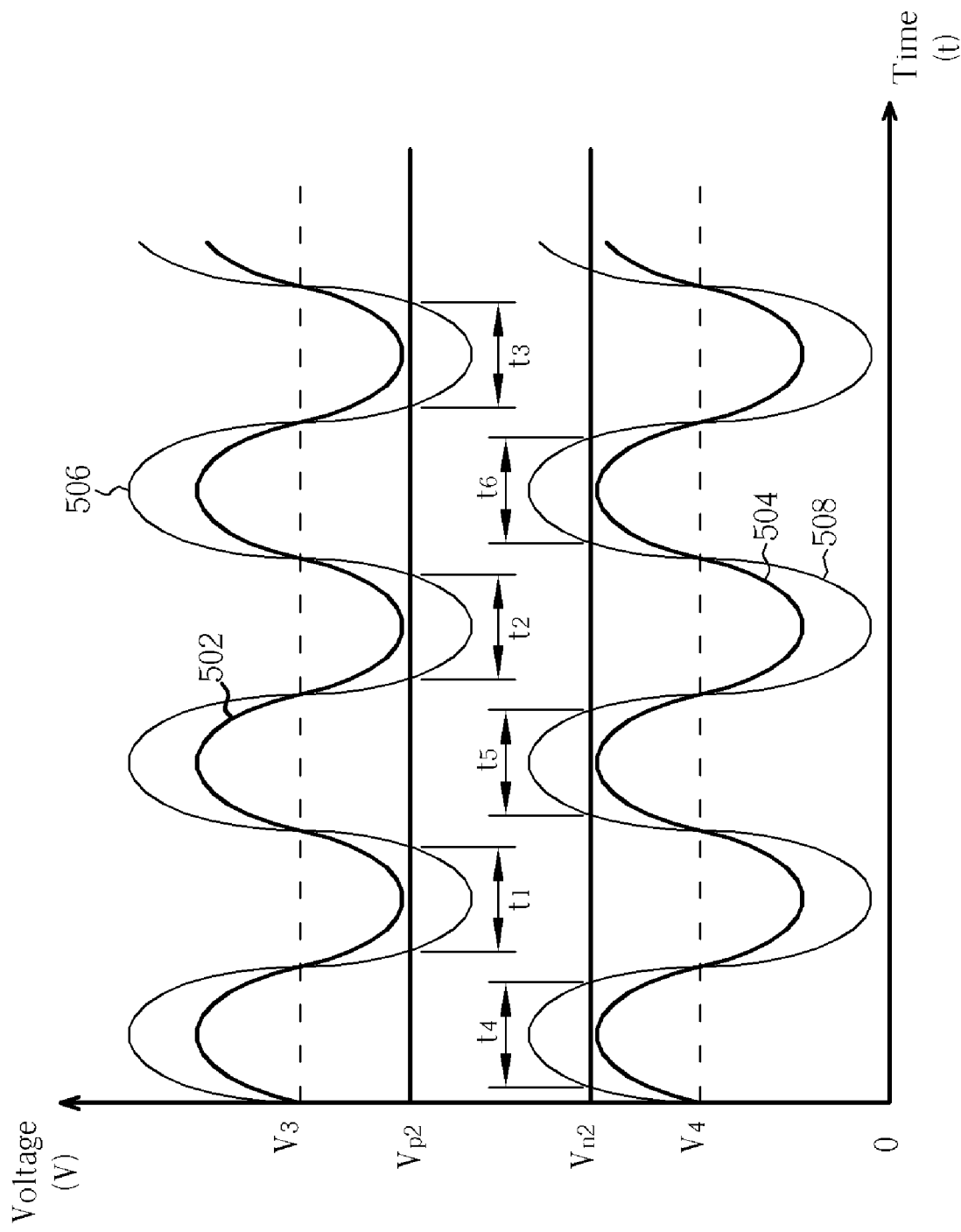
FIG. 5 is a diagram illustrating the voltage level variation at the terminals $N_3$ and $N_4$ of the apparatus of FIG. 3.

Please refer to FIG. 4 and FIG. 5. FIG. 4 is a waveform diagram illustrating the input signal $S_{in}$ of the apparatus 100 of FIG. 3, and FIG. 5 is a diagram illustrating the voltage level variation at the terminals $N_3$ and $N_4$ of the apparatus 100 of FIG. 3. When the amplitude of the input signal $S_{in}$ is within the range of $V_{ag1}$ (i.e. curve 402), the variation of the voltage level $V_3$ at the terminal $N_3$ is not lower than $V_{p2}$ (i.e. curve 502); the variation of the voltage level $V_4$ at the terminal $N_4$ is not higher than $V_{n2}$ (curve 504). Therefore, the first P-type transistor $M_{op1}$ and the first N-type transistor $M_{on1}$ are turned on, and the second P-type transistor $M_{op2}$ and the second N-type transistor $M_{on2}$ are turned off. In other words, the second output stage 1024 is enabled if the input signal $S_{in}$ is a first value without the range of $V_{ag1}$; the second output stage 1024 is disabled if the input signal $S_{in}$ is a second value within the range of $V_{ag1}$. The first output stage 1022 is enabled if the input signal is the first value or the second value (further description is detailed in the following). Accordingly, the current of the first P-type transistor $M_{op1}$ flows through the output terminal $N_{out}$ to charge the next stage circuit, and the current of the first N-type transistor $M_{on1}$ flows through the output terminal $N_{out}$ to discharge the next stage circuit. Please note that the voltages $V_{p2}$ and $V_{n2}$ are the threshold voltages of the second P-type transistor $M_{op2}$ and the second N-type transistor $M_{on2}$ respectively. When the amplitude of the input signal $S_{in}$ is beyond the range of $V_{ag1}$ (i.e. curve 404), the variation of the voltage level $V_3$ at the terminal $N_3$ will be partly lower than $V_{p2}$ (i.e. curve 506), and the variation of the voltage level $V_4$ at the terminal $N_4$ will be partly higher than $V_{n2}$ (i.e. curve 508). Therefore, the first P-type transistor $M_{op1}$ and the second P-type transistor $M_{op2}$ are turned on concurrently at the times $t_1, t_2, t_3$; and the first N-type transistor $M_{on1}$ and the second N-type transistor $M_{on2}$ are turned on concurrently at the times $t_4, t_5, t_6$. Similarly, at the times $t_1, t_2, t_3$, the current of the first P-type transistor $M_{op1}$ and the second P-type transistor $M_{op2}$ flow through the output terminal $N_{out}$ to charge the next stage circuit; and at the times $t_4, t_5, t_6$, the current of the first N-type transistor $M_{on1}$ and the second N-type transistor $M_{on2}$ flow through the output terminal $N_{out}$ to discharge the next stage circuit. Please refer to the prior art class AB amplifier 200 of FIG. 2. The current of the first output stage 1022 and the second output stage 1024 of the apparatus 100 has the maximum driving current $I_{N(max)}$ at the times $t_4, t_5, t_6$, as below:

$$I_{N(max)} = 0.5 \times K_n \times \beta_n \times (V_2)^2 + 0.5 \times K_n \times (Y-\beta_n) \times (V_2 - I_o \times Z)^2. \qquad (2)$$

Wherein, according to the above-mentioned equation (2), if $V_2$ is much larger than $I_o \times Z$, then the maximum driving current $I_{N(max)}$ approximates to:

$$I_{N(max)} \sim = 0.5 \times K_n \times Y \times (V_2)^2. \qquad (3)$$

In the equations (2) and (3), $K_n$ is the conductivity parameter of the N-type transistor. Similarly, according to the above-mentioned disclosure, those skilled in this art can easily derive the maximum driving current $I_{P(max)}$ of the first and second output stages 1022, 1024 of the apparatus 100 at the times $t_1, t_2, t_3$ of the present invention.

Furthermore, according to the above-mentioned equations, the maximum driving current $I_{N(max)}$ of the present invention is the same as the maximum driving current of the prior art. Therefore, the apparatus 100 of the present invention not only provides the first output stage 1022 in the static condition to have a better ability to resist noise with a better power consumption, but also has the same current driving ability as the prior art when the amplitude of the input signal $S_{in}$ is increasing. In other words, the driving current of the output signal $S_{out}$ of the apparatus 100 of the present invention is determined by the amplitude of the input signal $S_{in}$. In which, when the amplitude of the input signal $S_{in}$ is within the range of $V_{ag1}$, the rising edge and the falling edge of the output signal $S_{out}$ are driven by the current from the first P-type transistor $M_{op1}$ and the first N-type transistor $M_{on1}$, respectively; and when the amplitude of the input signal $S_{in}$ is beyond the range of $V_{ag1}$, the rising edge and the falling edge of the output signal $S_{out}$ are driven by the current from the first P-type transistor $M_{op1}$ and the second P-type transistor $M_{op2}$, and the first N-type transistor $M_{on1}$ and the second N-type transistor $M_{on2}$ respectively.

Please note that the first impedance device $R_1$, the second impedance device $R_2$, and the third impedance device $R_3$ of the signal generating circuit 102 in this embodiment can be implemented by any kind of resistance device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for generating an output signal according to an input signal, comprising:
    a signal generating circuit, for receiving the input signal and generating a first control signal comprising a first and a second voltage signal and a second control signal comprising a third and a fourth voltage signal;
    a first output stage, having a first amplifying configuration, for receiving the first control signal and generating a first output signal according to the first control signal; and
    a second output stage, having a second amplifying configuration, for receiving the second control signal and generating a second output signal according to the second control signal, wherein the first amplifying configuration is different from the second amplifying configuration;
    wherein the first output stage is coupled to the second output stage to form an output terminal, the output terminal outputs at least one of the first output signal and the second output signal as the output signal, and
    the signal generating circuit comprises:
        a first impedance unit having a first end for providing the third voltage signal and a second end for providing the first voltage signal;
        a second impedance unit having a first end for providing the second voltage signal and a second end for providing the fourth voltage signal; and
        a third impedance unit, coupled between the first impedance unit and the second impedance unit, comprising a transistor pair for receiving the input signal.

2. The apparatus of claim 1, wherein the first output stage comprises a first transistor and a second transistor, and the first transistor is coupled to the second transistor in series.

3. The apparatus of claim 1, wherein the second output stage comprises a third transistor and a fourth transistor, and the third transistor is coupled to the fourth transistor in series.

4. The apparatus of claim 2, wherein the first amplifying configuration is a class AB amplifying configuration.

5. The apparatus of claim 3, wherein the second amplifying configuration is a class B amplifying configuration.

6. The apparatus of claim 1, wherein the signal generating circuit further comprises:
    a first current source coupled to the first impedance unit; and a second current source coupled to the second impedance unit.

7. The apparatus of claim 1, wherein the second impedance device comprises at least one transistor.

8. The apparatus of claim 1, wherein the second output stage is enabled if the input signal is a first value; the second output stage is disabled if the input signal is a second value.

9. The apparatus of claim 8, wherein the first output stage is enabled if the input signal is the first value or the second value.

10. The apparatus of claim 1, wherein an amount of the second output signal is larger than that of the first output signal.

11. An apparatus for generating an output signal according to an input signal, comprising:

a signal generating circuit, for receiving the input signal, and generating a first control signal comprising a first and a second voltage signal and a second control signal comprising a third and a fourth voltage signal according to the input signal;

a first output stage, for receiving the first control signal and outputting an output signal according to the first control signal; and a second output stage, coupled to the first output stage, for receiving the second control signal and outputting the output signal according to the second control signal;

wherein when the input signal is a first value, the first and the second output stages are enabled; and when the input signal is a second value, the second output stage is disabled; and the signal generating circuit comprises:
- a first impedance having a first end for providing the third voltage signal and a second end for providing the first voltage signal;
- a first current source coupled to the first end of the first impedance;
- a second impedance having a first end for providing the second voltage signal and a second end for providing the fourth voltage signal; and
- a second current source coupled to a second end of the second impedance; and
- a third impedance coupled between the first impedance and the second impedance.

12. The apparatus of claim 11, wherein the first output stage comprises a first transistor and a second transistor, and the first transistor is coupled to the second transistor in series.

13. The apparatus of claim 12, wherein the second output stage comprises a third transistor and a fourth transistor, and the third transistor is coupled to the fourth transistor in series.

14. The apparatus of claim 12, wherein the first and the second transistors are biased to be a class AB amplifying configuration, and the third and the fourth transistors are biased to be a class B amplifying configuration.

15. The apparatus of claim 11, wherein the third impedance comprises a transistor pair for receiving the input signal.

16. A method for receiving an input signal and outputting an output signal, comprising:

utilizing a signal generating circuit for generating a first control signal comprising a first voltage signal and a second voltage signal and a second control signal comprising a third voltage signal and a fourth voltage signal according to the input signal;

utilizing a first output stage having a first amplifying configuration to generate a first output signal according to the first control signal; and utilizing a second output stage having a second amplifying configuration to generate a second output signal according to the second control signal;

wherein the output signal comprises at least one of the first output signal and the second output signal;

wherein the first amplifying configuration is different from the second amplifying configuration; and the signal generating circuit comprises:
- a first impedance having a first end for providing the third voltage signal and a second end for providing the first voltage signal;
- a second impedance having a first end for providing the second voltage signal and a second end for providing the fourth voltage signal; and
- a transistor pair, coupled between the first impedance and the second impedance, for receiving the input signal.

17. The method of claim 16, wherein when the input signal is a first value, the first and the second output stages are enabled; and when the input signal is a second value, the second output stage is disabled.

18. The method of claim 16, wherein the first amplifying configuration is a class AB amplifying configuration, and the second amplifying configuration is a class B amplifying configuration.

19. The method of claim 18, wherein an amount of the second output signal is larger than that of the first output signal.

20. The method of claim 16, wherein the signal generating circuit further comprises:
a first current source coupled to the first impedance; and
a second current source coupled to the second impedance.

* * * * *